(12) United States Patent
Hu et al.

(10) Patent No.: US 11,356,085 B2
(45) Date of Patent: Jun. 7, 2022

(54) PWM WAVEFORM GENERATION DEVICE AND METHOD THEREOF

(71) Applicant: AMLOGIC (SHANGHAI) CO., LTD., Shanghai (CN)

(72) Inventors: Jian Hu, Shanghai (CN); Bo Yang, Shanghai (CN); Xuhua Zhang, Shanghai (CN); Chaoyang Luo, Shanghai (CN); Xingyu Chen, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/325,515

(22) PCT Filed: Sep. 27, 2018

(86) PCT No.: PCT/CN2018/108105
§ 371 (c)(1),
(2) Date: Feb. 14, 2019

(87) PCT Pub. No.: WO2019/137040
PCT Pub. Date: Jul. 18, 2019

(65) Prior Publication Data
US 2021/0336615 A1    Oct. 28, 2021

(30) Foreign Application Priority Data
Jan. 9, 2018 (CN) .......................... 201810019997.3

(51) Int. Cl.
*H03K 7/08* (2006.01)
*H04J 3/04* (2006.01)

(52) U.S. Cl.
CPC . *H03K 7/08* (2013.01); *H04J 3/04* (2013.01)

(58) Field of Classification Search
CPC ..................................... H03K 7/08; H04J 3/04
USPC .......................................................... 327/175
See application file for complete search history.

(56) References Cited

FOREIGN PATENT DOCUMENTS

| CN | 105375907 A | * | 3/2016 |
|---|---|---|---|
| CN | 105375907 A | | 3/2016 |
| JP | 2008263727 A | | 10/2008 |

* cited by examiner

*Primary Examiner* — Tomi Skibinski
(74) *Attorney, Agent, or Firm* — Wolter Van Dyke Davis, PLLC; Robert L. Wolter

(57) ABSTRACT

The PWM waveform generation device comprises a time-division multiplexing module, wherein the time-division multiplexing module is configured for receiving a first preprocessing signal and a second preprocessing signal output by two system clock sources, performing a first time-division processing on the first preprocessing signal to obtain a first time-division signal, and performing a second time-division processing on the second preprocessing signal to obtain a second time-division signal according to a preset strategy, performing multiplexing processing on the first time-division signal and the second time-division signal to obtain a PWM output signal, wherein an output frequency of the PWM output signal is a default standard clock frequency. The present invention has the advantages that the cycle length of one cycle of a PWM waveform depends on cycles of two preprocessing waveforms and the number of the cycles, such that the output waveform frequency may be calibrated to a desired frequency.

6 Claims, 1 Drawing Sheet

PWM WAVEFORM GENERATION DEVICE AND METHOD THEREOF

CROSS-REFERENCE TO RELATED APPLICATIONS

This application is a national phase of Ser. No.: PCT/CN2018/108105 filed Sep. 27, 2018, the entire contents of which is incorporated herein by reference, and which claims priority to and the benefit of Chinese Patent Application No. 201810019997.3 filed Jan. 9, 2018.

BACKGROUND OF THE INVENTION

1. Field of the Invention

The invention relates to the technical field of generation of PWM signals, and more particularly, to a PWM waveform generation device and method thereof.

2. Description of the Related Art

In general, working clocks are essential parts for embedded devices, and some of the working clocks are provides by PWM. PWM waveform refers to a waveform in a certain frequency output by a clock source after it is subjected to frequency division coefficient. The working clock is required to be precise, if the working clock is not precise after being subjected to frequency division, it will result in an unstable operation state of the device.

Additionally, there is an error in parameters of PWM waveform output theoretically and actually, such as a frequency and a duty cycle; and it is not easy to adjust the frequency.

Those skilled in the art usually adopt a solution to the above-mentioned problems based on the following formula:

$$f_{out} = \frac{f_{source}}{N},$$

wherein $f_{out}$ represents the PWM output frequency;
$f_{source}$ represents the system clock source; and
N represents the frequency division coefficient.

In order to obtain a more accurate frequency of PWM output actually, the size of the system clock source can be adjusted when a plurality of system clock sources are available. However, it should be noted that the number of the system clock source is constant, and the related values are constant.

Another method is to adjust the frequency division coefficient. The frequency division coefficient N can be obtained from the PWM output frequency and the clock source frequency. If a desired frequency is not achieved, N can be adjusted left and right to get closer to the desired frequency.

From the above analysis, some defects can be found in both the first method and the second method. For the first method, it has some limitations, far example, the size of the system clock source cannot be adjusted using the parameters when a PWM controller is not equipped with a plurality of system clock sources; for the second method, errors are inevitable even the clock source is subjected to frequency division, and hence, an accurate desired PWM output frequency cannot be obtained.

SUMMARY OF THE INVENTION

In order to solve the problems found in the prior art, the present invention provides a PWM waveform generation device with high precision and calibratable frequency, and a method thereof.

The technical solution set forth in the present invention is as follows:

A PWM waveform generation device, comprising:
a time-division multiplexing module for receiving a first preprocessing signal and a second preprocessing signal, performing a first time-division processing on the first preprocessing signal to obtain a first time-division signal, and performing a second time-division processing on the second preprocessing signal to obtain a second time-division signal according to a preset strategy performing multiplexing processing on the first time-division signal and the second time-division signal to obtain a PWM output signal, wherein an output frequency of the PWM output signal is a default standard clock frequency.

Preferably, the time-division multiplexing module is configured to receive the first preprocessing signal output by a first system clock source, and the second preprocessing signal output by a second system clock source.

Preferably, the time-division multiplexing module performs the multiplexing processing by using the following formula:

$$f_{out} = \frac{f_1 + f_2}{2},$$

wherein $f_{out}$ represents a cycle length of a waveform corresponding to the output signal;
$f_1$ represents a cycle length of a waveform corresponding to the first time-division signal; and
$f_2$ represents a cycle length of a waveform corresponding to the second time-division signal.

Preferably, the time-division multiplexing module performs the first time-division processing, the second time-division processing and the multiplexing processing by using the following formula:

$$f = \frac{x*f_1 + y*f_2}{x+y},$$

wherein f represents a cycle length of a waveform corresponding to the output signal;
$f_1$ represents a cycle length of a waveform corresponding to the first time-division signal; and
$f_2$ represents a cycle length of a waveform corresponding to the second time-division signal; and
x represents the cycle number of a waveform corresponding to the first time-division signal;
y represents the cycle number of a waveform corresponding to the second time-division signal.

Preferably, the preset strategy is to obtain the PWM output signal by adjusting the cycle length and the cycle number of the waveform corresponding to the first time-division signal, and the cycle length and the cycle number of the waveform corresponding to the second time-division signal, respectively.

A method for generation of a PWM waveform, comprising:

time-division multiplexing module receiving a first preprocessing signal and a second preprocessing signal output by two system clock sources, performing a first time-division processing on the first preprocessing signal to obtain a first time-division signal, and performing a second time-division processing on the second preprocessing signal to obtain a second time-division signal according to a preset strategy, performing multiplexing processing on the first time-division signal and the second time-division signal to obtain a PWM output signal, wherein an output frequency of the PWM output signal is a default standard clock frequency.

Preferably, the time-division multiplexing module is configured to receive the first preprocessing signal output by a first system clock source, and the second preprocessing signal output by a second system clock source.

Preferably, the time-division multiplexing module performs the multiplexing processing by using the following formula:

$$f_{out} = \frac{f_1 + f_2}{2},$$

wherein $f_{out}$ represents a cycle length of a waveform corresponding to the output signal;

$f_1$ represents a cycle length of a waveform corresponding to the first time-division signal; and $f_2$ represents a cycle length of a waveform corresponding to the second time-division signal.

Preferably, the time-division multiplexing module performs the first time-division processing, the second time-division processing and the multiplexing processing by using the following formula:

$$f = \frac{x * f_1 + y * f_2}{x + y},$$

wherein f represents a cycle length of a waveform corresponding to the output signal;

$f_1$ represents a cycle length of a waveform corresponding to the first time-division signal; and $f_2$ represents a cycle length of a waveform corresponding to the second time-division signal; and x represents the cycle number of a waveform corresponding to the first time-division signal;

y represents the cycle number of a waveform corresponding to the second time-division signal.

Preferably, the preset strategy is to obtain the PWM output signal by adjusting the cycle length and the cycle number of the waveform corresponding to the first time-division signal, and the cycle length and the cycle number of the waveform corresponding to the second time-division signal, respectively.

The present invention has the advantages that the cycle length of one cycle of a PWM waveform depends on cycles of two preprocessing waveforms and the number of the cycles, such that the output waveform frequency may be calibrated to a desired frequency.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
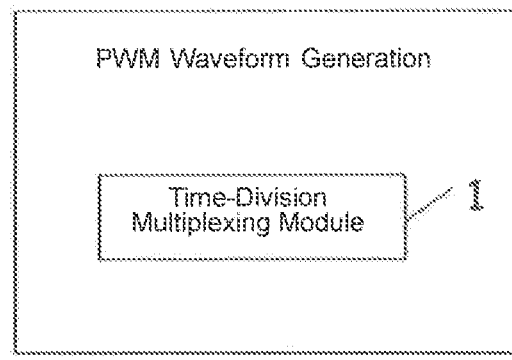
FIG. 1 is a schematic diagram of functional blocks of a PWM waveform generation device in a preferred embodiment according to the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific ter used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

As shown in FIG. 1, a PWM waveform generation device comprises:

a time-division multiplexing module 1 for receiving a first preprocessing signal and a second preprocessing signal output by two system clock sources, performing a first time-division processing on the first preprocessing signal to obtain a first time-division signal, and per forming a second time-division processing on the second preprocessing signal to obtain a second time-division signal according to a preset strategy, performing multiplexing processing on the first time-division signal and the second time-division signal to obtain a PWM output signal, wherein an output frequency of the PWM output signal is a default standard clock frequency.

In this embodiment, period of a cycle of the PWM waveform depends on cycles of two preprocessing waveforms and the number of the cycles, such that the output waveform frequency can be calibrated to a desired frequency.

A method for generation of a PWM waveform comprises:

a time-division multiplexing module 1 receiving a first preprocessing signal and a second preprocessing signal output by two system clock sources, performing a first time-division processing on the first preprocessing signal to obtain a first time-division signal, and performing a second time-division processing on the second preprocessing signal to obtain a second time-division signal according to a preset strategy, performing multiplexing processing on the first time-division signal and the second tune-division signal to obtain a PWM output signal, wherein an output frequency of the PWM output signal is a default standard clock frequency.

In a preferred embodiment, the above-mentioned time-division multiplexing module 1 performs the multiplexing processing by using the following formula:

$$f_{out} = \frac{f_1 + f_2}{2},$$

wherein $f_{out}$ represents a cycle length of a waveform corresponding to the output signal;

$f_1$ represents a cycle length of a waveform corresponding to the first time-division signal; and $f_2$ represents a cycle length of a waveform corresponding to the second time-division signal.

In a preferred embodiment, the above-mentioned time-division multiplexing module 1 performs the first time-division processing, the second time-division processing and the multiplexing processing by using the following formula:

$$f = \frac{x*f_1 + y*f_2}{x+y},$$

wherein f represents a cycle length of a waveform corresponding to the output signal;

$f_1$ represents a cycle length of a waveform corresponding to the first time-division signal; and $f_2$ represents a cycle length of a waveform corresponding to the second time-division signal; and x represents the cycle number of a waveform corresponding to the first time-division signal;

y represents the cycle number of a waveform corresponding to the second time-division signal.

In a preferred embodiment, the preset strategy is to obtain the PWM output signal by adjusting the cycle length and the cycle number of the waveform corresponding to the first time-division signal, and the cycle length and the cycle number of the waveform corresponding to the second time-division signal, respectively.

Figure 2:
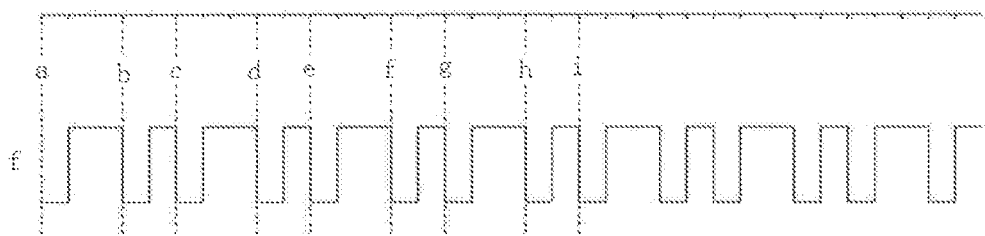
FIG. 2 is a schematic diagram of a PWM waveform output by a double-channel waveform in a preferred embodiment according to the present invention.

As shown in FIG. 2, in a specific embodiment, the first method is a time-division multiplexing method. In this method, a waveform is synthesized after time-division output of two different waveforms, wherein ab, cd, and ef are one cycle of the waveform $f_1$; bc, de, and hi are one cycle of the waveform $f_2$, and ac is one cycle of the output waveform, and the final output frequency is:

$$f_{out} = \frac{f_1 + f_2}{2},$$

wherein the output frequency depends on $f_1$ and $f_2$, such that $f_1$ and $f_2$ can be separately adjusted to output the waveform in precise frequency.

Figure 3:
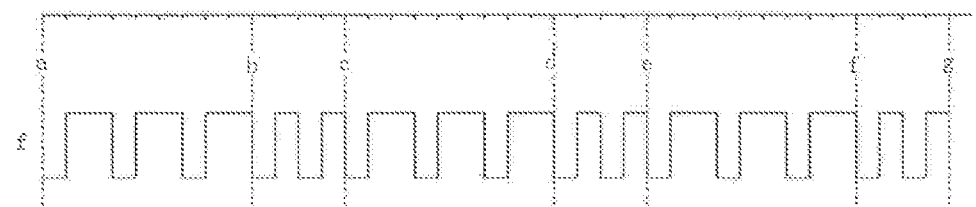
FIG. 3 is a schematic diagram of a PWM waveform output by a double-channel variable cycle in a preferred embodiment according to the present invention.

As shown in FIG. 3, in a specific embodiment, the second method is improved based on the first method, and a parameter, the cycle number of the waveform, is added, wherein ab, cd, and ed are waveform $f_1$; bc, de, and fg are waveform $f_2$. As shown in FIG. 2, $f_1$ has three cycles, and $f_2$ has two cycles, and the number of cycles of the two waveforms is set to a variable parameter, and the cycle of the synthesized waveform varies depending on the two cycles. The output frequency can be given by:

$$f = \frac{x*f_1 + y*f_2}{x+y};$$

and ac is one cycle of the PWM waveform, and the cycle size depends on the cycles of the two waveforms and the number of cycles, such that the output waveform frequency can be calibrated to a desired frequency.

The above descriptions are only the preferred embodiments of the invention, not thus limiting the embodiments and scope of the invention. Those skilled in the art should be able to realize that the schemes obtained from the content of specification and drawings of the invention are within the scope of the invention

What is claimed is:

1. A PWM waveform generation device, comprising:
a time-division multiplexing module for receiving a first preprocessing signal and a second preprocessing signal, performing a first time-division processing on the first preprocessing signal to obtain a first time-division signal, and performing a second time-division processing on the second preprocessing signal to obtain a second time-division signal according to a preset strategy, performing multiplexing processing on the first time-division signal and the second time-division signal to obtain a PWM output signal, wherein an output frequency of the PWM output signal is a default standard clock frequency;
the time-division multiplexing module performs the first time-division processing, the second time-division processing and the multiplexing processing by using the following formula:

$$f = \frac{x*f_1 + y*f_2}{x+y},$$

wherein f represents a cycle length of a waveform corresponding to the PWM output signal;
$f_1$ represents a cycle length of a waveform corresponding to the first time-division signal;
$f_2$ represents a cycle length of a waveform corresponding to the second time-division signal;
x represents a cycle number of a waveform corresponding to the first time-division signal; and
y represents a cycle number of a waveform corresponding to the second time-division signal.

2. The PWM waveform generation device as claimed in claim 1, wherein the time-division multiplexing module is configured to receive the first preprocessing signal output by a first system clock source, and the second preprocessing signal output by a second system clock source.

3. The PWM waveform generation device as claimed in claim 1, wherein the preset strategy is to obtain the PWM output signal by adjusting the cycle length and the cycle number of the waveform corresponding to the first time-division signal, and the cycle length and the cycle number of the waveform corresponding to the second time-division signal, respectively.

4. A method for generation of a PWM waveform, comprising:

a time-division multiplexing module receiving a first preprocessing signal and a second preprocessing signal output by two system clock sources, performing a first time-division processing on the first preprocessing signal to obtain a first time-division signal, and performing a second time-division processing on the second preprocessing signal to obtain a second time-division signal according to a preset strategy, performing multiplexing processing on the first time-division signal and the second time-division signal to obtain a PWM output signal, wherein an output frequency of the PWM output signal is a default standard clock frequency;

wherein the time-division multiplexing module performs the first time-division processing, the second time-division processing and the multiplexing processing by using the following formula:

$$f = \frac{x*f_1 + y*f_2}{x+y},$$

wherein f represents a cycle length of a waveform corresponding to the PWM output signal;

$f_1$ represents a cycle length of a waveform corresponding to the first time-division signal;

$f_2$ represents a cycle length of a waveform corresponding to the second time-division signal;

x represents a cycle number of a waveform corresponding to the first time-division signal; and y represents a cycle number of a waveform corresponding to the second time-division signal.

5. The PWM waveform generation device as claimed in claim 4, wherein the time-division multiplexing module is configured to receive the first preprocessing signal output by a first system clock source, and the second preprocessing signal output by a second system clock source.

6. The PWM waveform generation device as claimed in claim 4, wherein the preset strategy is to obtain the PWM output signal by adjusting the cycle length and the cycle number of the waveform corresponding to the first time-division signal, and the cycle length and the cycle number of the waveform corresponding to the second time-division signal, respectively.

* * * * *